United States Patent [19]
Reeves

[11] 3,959,578
[45] May 25, 1976

[54] LIGHTING FIXTURE

[75] Inventor: Melbourne C. Reeves, Wheatridge, Colo.

[73] Assignee: Keene Corporation, New York, N.Y.

[22] Filed: Apr. 9, 1975

[21] Appl. No.: 566,172

[52] U.S. Cl. .......... 174/65 R; 40/130 R; 220/281; 220/323
[51] Int. Cl.² .......... H05K 5/04
[58] Field of Search .......... 174/65 R, 50; 220/3.8, 220/281, 323, 324, 326; 40/130 R

[56] References Cited

UNITED STATES PATENTS

| | | | |
|---|---|---|---|
| 799,989 | 9/1905 | Klein | 220/324 X |
| 1,039,955 | 10/1912 | Keefe | 220/3.8 |
| 1,239,243 | 9/1917 | Wuensch | 220/324 |
| 3,136,083 | 6/1964 | Guth | 40/130 R |
| 3,402,494 | 9/1968 | Gray | 40/130 R |

*Primary Examiner*—J. V. Truhe
*Assistant Examiner*—David A. Tone
*Attorney, Agent, or Firm*—Kane, Dalsimer, Kane, Sullivan and Kurucz

[57] ABSTRACT

An electrical lighting fixture is provided. The fixture comprises a housing containing conventional electrical components therein. The housing has front and rear surfaces and walls extending between the surfaces. At least one cable opening extends through the wall and a plate is positioned within the housing abutting the wall. The plate includes a main body portion and a plug extending outwardly from the body portion. The plug is dimensioned to fit in and fill the opening. Clip means within the housing secure the plate in position. The plate is further provided with lugs on opposite sides of the plug which engage guide holes in the wall on opposite sides of the cable opening. The housing is formed of a cast metal with the cable opening and guide openings integrally formed with the housing.

8 Claims, 4 Drawing Figures

LIGHTING FIXTURE

BACKGROUND OF THE INVENTION

The present invention relates to lighting fixtures and more particularly to an improvement in die cast lighting fixtures.

Lighting fixtures are conventionally supplied with means for drawing the cable feeding the fixture into the fixture from various different positions. This permits the fixture to be hung in any one of several possible orientations. Where the fixtures are formed of sheet metal, the fixture cable openings are partially cut in the sheet metal thereby defining knockouts which can easily be removed in the field by an electrician after he determines which knockout or knockouts provide the best entry for passing wires or mounting studs.

Heretofore, there has been no equally convenient way to provide openings or holes for passing wires or mounting studs through die cast fixtures. The usual way this was done with die cast fixtures was to cast undercut recesses at each hole location leaving a relatively thin thickness of metal around the perimeter of each proposed hole. In the field, the electrician had to break or fracture the die cast part at the thin section to define the hole. Unfortunately, this is not a very satisfactory arrangement since often the wall of the casting breaks out next to the hole or a ragged edge is left around the hole which could tear the insulation on the wiring drawn therethrough thus resulting in a hazardous and dangerous condition.

As an alternate to the above approach, some die cast fixtures are provided with "drill points" in place of the above described undercut recesses. In this type of fixture, small conical recesses are cast in the wall of the fixture to help the installer locate and drill each hole as needed. The obvious shortcoming of this arrangement is that it requires that the electrician, prior to installing the fixture, drill holes as required in the field. This method is thus both time consuming and burdensome and therefore costly.

In view of the above, it is the principal object of the present invention to provide an improved die cast lighting fixture in which any of several wiring holes may be made accessible by the installer in the field simply and easily.

SUMMARY OF THE INVENTION

The above and other beneficial objects and advantages are attained in accordance with the present invention by providing an electrical lighting fixture which comprises a housing containing conventional electrical components therein. The housing has front and rear surfaces and walls extending between the surfaces. At least one cable opening extends through at least one wall and a plate is positioned within the housing abutting the wall. The plate includes a main body portion and a plug extending outwardly from the body portion. The plug is dimensioned to fit in and fill the opening. Clip means within the housing secure the plate in position. The plate is further provided with lugs on opposite sides of the plug which engage guide holes in the wall on opposite sides of the cable opening. The housing is formed of a cast metal with the cable opening and guide openings integrally formed with the housing.

DETAILED DESCRIPTION OF THE PREFERRED EMBODIMENT

Figure 1:
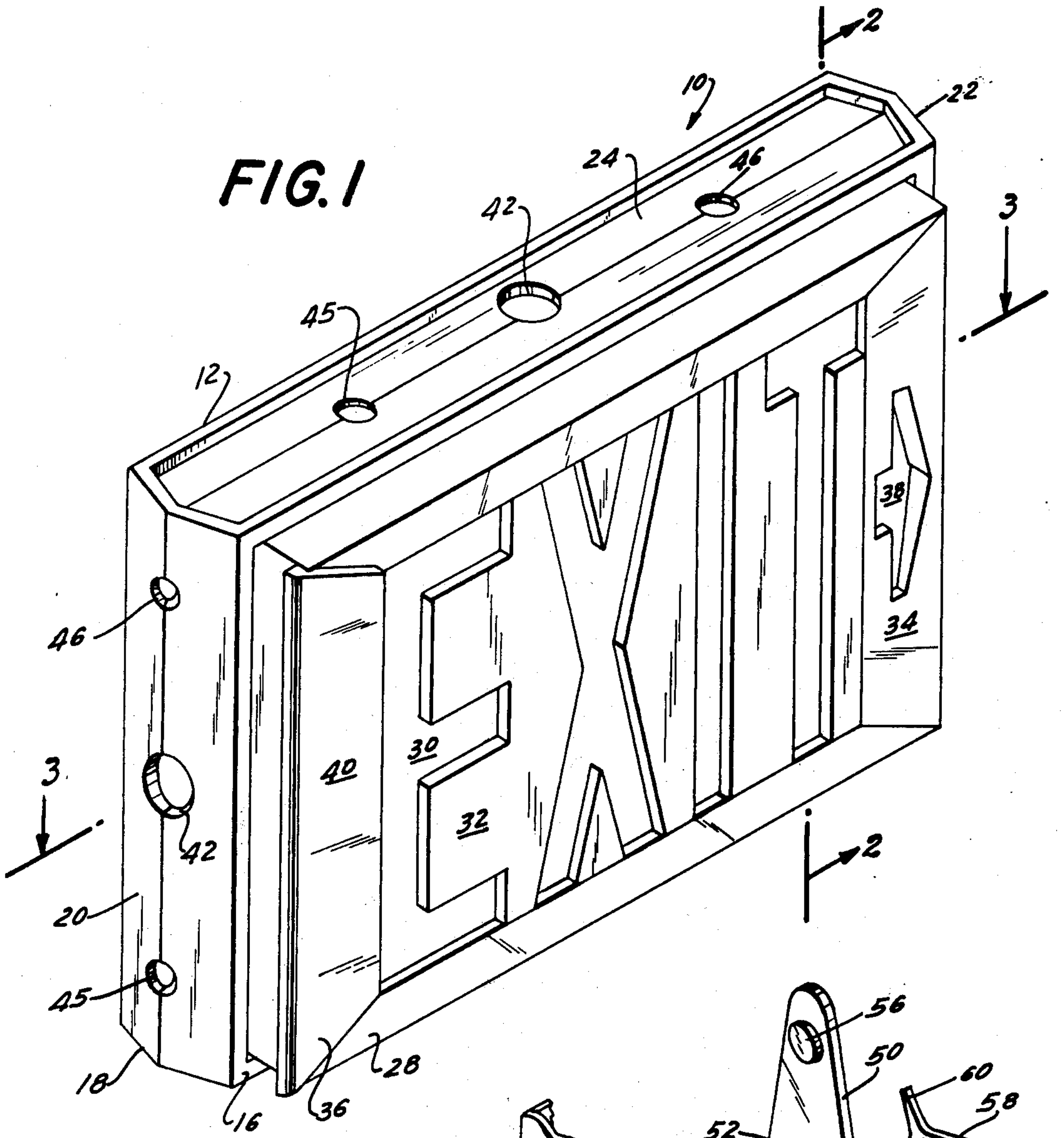
FIG. 1 is a perspective view of a lighting fixture in accordance with the present invention.
Figure 4:
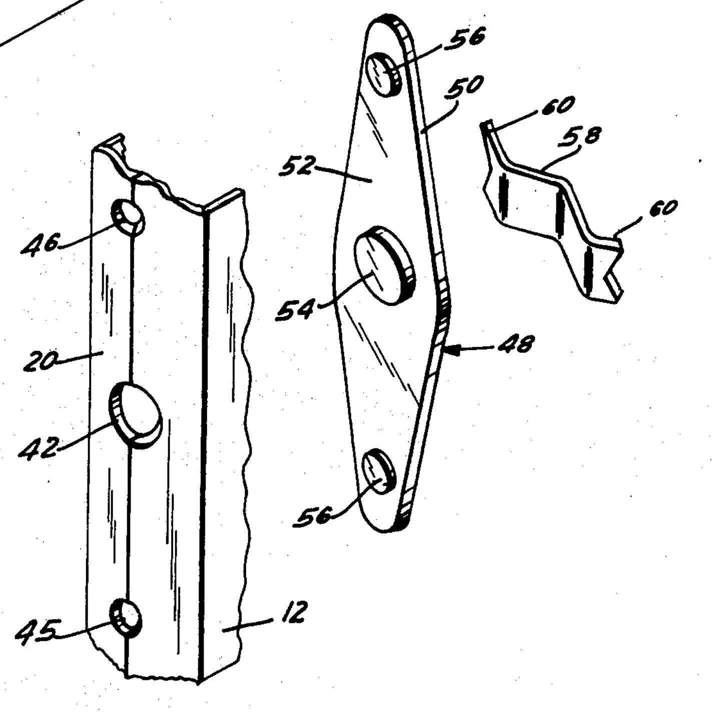
Figure 2:
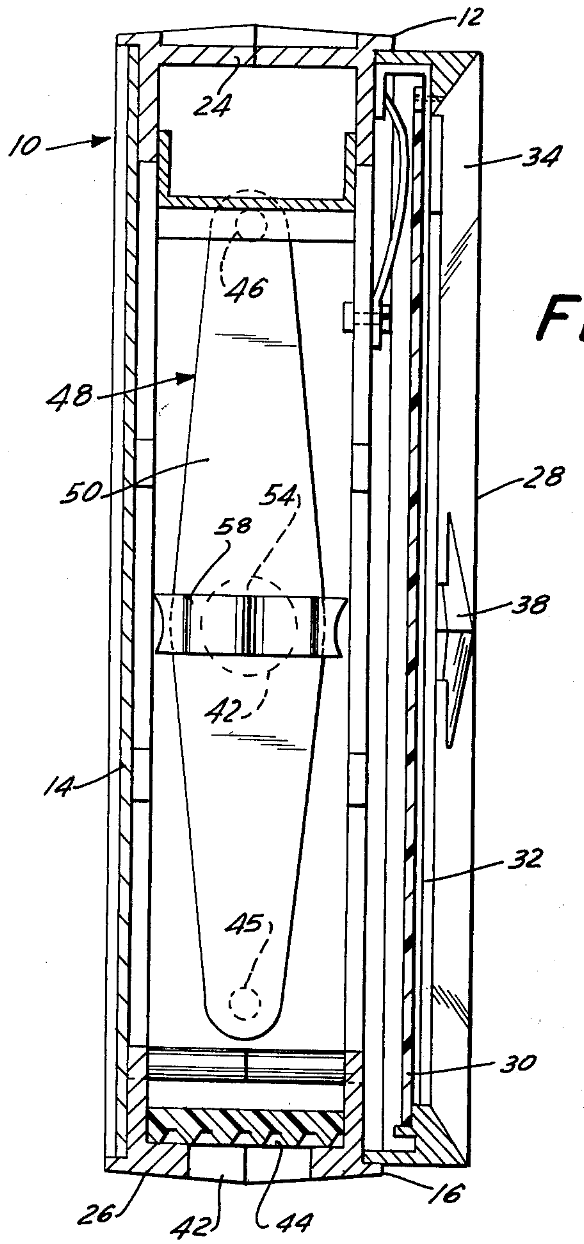
FIG. 2 is a sectional view taken along reference lines 2—2 of FIG. 1 in the direction indicated by the arrows.

Reference is now made to the drawings wherein similar components bear the same reference numeral throughout the several views.

Reference is first made to FIG. 1 wherein an emergency lighting fixture 10 in accordance with the present invention is shown. The fixture includes a die cast aluminum housing generally designated by the numeral 12. Housing 12 has a generally flat rear surface 14, a front surface 16 and a wall 18 extending between the front and rear surfaces. The wall 18 comprises a pair of opposed sidewalls 20 and 22 as well as top and bottom walls 24 and 26.

The major portion of the front surface 16 is open and surrounded by a frame 28. A diffuser panel 30 overlies the opening and an insert 32 with the word "EXIT" cut therein overlies the diffuser. It should be appreciated that while this preferred embodiment is directed at an exit sign light fixture, the present invention is by no means limited to such fixtures and would apply equally to any die cast fixture regardless of its intended use.

The sides 34 and 36 of frame 28 are provided with cutout arrow configurations 38. A panel 40 overlies one of the frame sides so that only the arrow pointed in the desired direction is exposed. The bottom wall of housing 12 contains an opening 42 and a suitable diffuser plate 44 overlies this opening.

In accordance with the present invention, a plurality of cable or wire openings 42 are provided in the housing wall disposed about the periphery of the housing. The wire opening 42 is dimensioned in accordance with practice and code requirements to enable a cable to be drawn into the fixture housing and locked in place in a conventional manner.

Contained within the fixture housing are the conventional lamp sockets and the like designed to be wired to the cable wires brought into the fixture. First and second guide holes 45 and 46 are provided on opposite sides of the wire opening 42 as shown. The guide holes 45 and 46 in addition to preventing rotation of the plate, also serve to receive mounting bolts to permit the fixture to be mounted to a cable box in a conventional manner and to this end are spaced apart a distance compatible with existing boxes. Within the housing abutting the walls and overlying the cable and guide openings there is provided a closure plate 48. Thus, as the fixture is supplied by the manufacturer there is one plate 48 for each wire opening 42.

Figure 3:
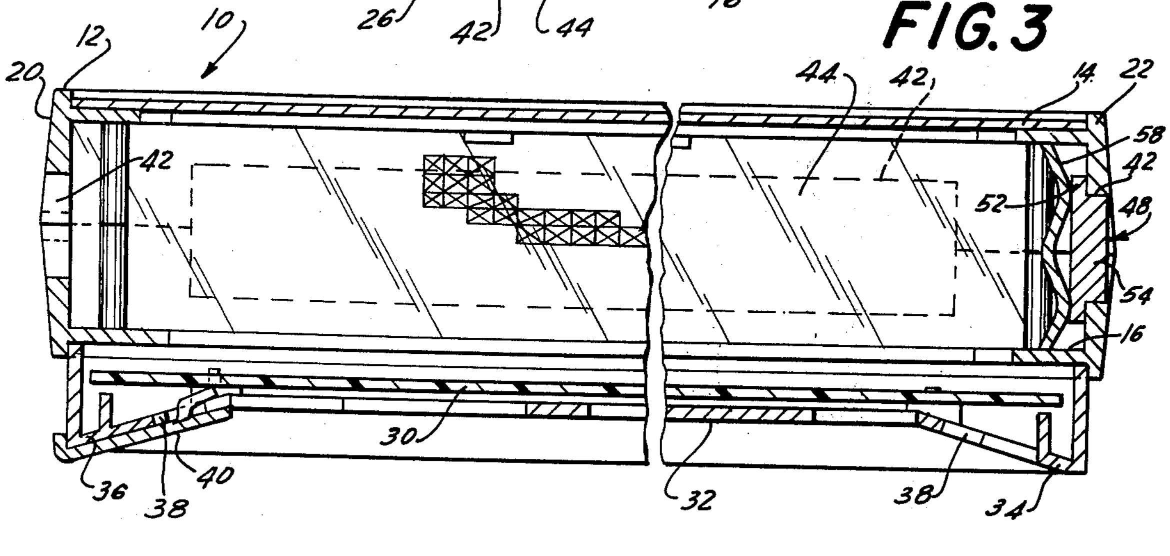
FIG. 3 is a sectional view taken along reference lines 3—3 of FIG. 1 in the direction indicated by the arrows; and, FIG. 4 is a fragmentary perspective view depicting a section of the fixture wall, closure plate and clip of the present invention.

Plate 48 comprises a die cast member formed of the same material and finished in the same manner as the housing. The plate comprises generally flat main body member 50 having a top surface 52 from which a plug 54 and a pair of guide lugs 56 extend outwardly. The plug is dimensioned to fill the cable opening 42. Similarly, each of the guide lugs 56 is designed to fit into one of the guide holes 45 and 46. In this connection, the plug 54 and guide lugs 56 each extend outwardly a distance substantially equal to the thickness of the housing so that when the plate is in position with the wire opening 42 and guide holes 45 and 46 blocked the outer surface of the housing is generally flush. Where guide holes 45 and 46 are not required to receive mounting bolts, these holes and the plate lugs may be eliminated. If necessary, the wire hole 42 and plate plug 54 may be keyed to each other to prevent rotation. Plate 48 is held in position by a spring clip 58. Clip 58 comprises an elongated member formed of spring steel or the like and is slightly longer than the distance between the front and rear faces of the fixture housing. Thus, the clip may be deformed to fit within the housing between the front and rear surfaces and then allowed to relax and stretch to securely engage these surfaces as shown in FIG. 3. In this connection, the ends of the clip may be pointed to a sharp tip 60 so that they bite into the inner surfaces of the housing.

As stated, the fixture is provided with a plate 48 for each wire opening 42 and each plate is held in position by clip 58. As best seen in FIG. 3, when in position, the closure plates are flush with the exterior surfaces of the fixture walls and thus are hardly noticeable. When the electrician decides which is the most suitable opening or openings for drawing wires and mounting studs through the fixture, he removes the plate covering those openings by merely pushing inwardly on the plug portion 54 of the plate through the opening 42. With a sufficient force, roughly comparable to that necessary to remove a knockout from a sheet metal fixture, the clip 58 is overcome and the plate falls into the fixture from which it may be removed. The electrician then brings his cable into the fixture and secures it in the conventional manner and wires the lamp sockets within the fixture.

As stated previously, it should be understood that notwithstanding the fact that the present description of the invention is directed at an exit sign type fixture, the present invention is not limited to such fixtures and may be used in accordance with any type of die cast fixture.

Thus, in accordance with the above, the aforementioned objective is effectively attained.

Having thus described my invention, what is claimed is:

1. An electrical lighting fixture comprising: a housing; fixture components contained within said housing; front and rear surfaces of said housing; a housing wall extending between said front and rear surfaces; a cable opening extending through said wall; a plate positioned within said housing abutting said wall, said plate including a main body portion and plug means extending outwardly from said body portion fitting in and filling said opening; and clip means securing said plate in position.

2. The fixture in accordance with claim 1 further comprising at least one guide hole in said wall spaced apart a distance from said cable opening and said plate includes guide means extending from said main body portion spaced apart from said plug means an equal distance.

3. The fixture in accordance with claim 2 further comprising a second guide hole in said wall on the opposite side of said opening from said guide means and second guide means on said plate.

4. The invention in accordance with claim 1 wherein said housing is formed of a cast metal.

5. The invention in accordance with claim 1 wherein said plug means extends outwardly for a distance substantially equal to the thickness of said wall.

6. The invention in accordance with claim 2 wherein said plug means and guide means each extend outwardly for a distance substantially equal to the thickness of said wall.

7. The fixture in accordance with claim 1 further comprising a plurality of cable openings extending through said housing, an equal plurality of plate means positioned within said housing each filling an opening, and an equal plurality of clip means each securing one of said plate means in position.

8. The fixture in accordance with claim 1 wherein said clip means comprises an elongated spring steel member having a length slightly longer than the distance between said housing front and rear surfaces, said member having means at the ends thereof engaging said surfaces.

* * * * *